United States Patent
Shi et al.

(10) Patent No.: US 9,062,230 B2
(45) Date of Patent: Jun. 23, 2015

(54) CHEMICAL MECHANICAL POLISHING (CMP) COMPOSITION FOR SHALLOW TRENCH ISOLATION (STI) APPLICATIONS AND METHODS OF MAKING THEREOF

(71) Applicant: AIR PRODUCTS AND CHEMICALS, INC., Allentown, PA (US)

(72) Inventors: Xiaobo Shi, Chandler, AZ (US); John Edward Quincy Hughes, Cave Creek, AZ (US); Hongjun Zhou, Chandler, AZ (US); Daniel Hernandez Castillo, II, Laveen, AZ (US); Jae Ouk Choo, Chandler, AZ (US); James Allen Schlueter, Phoenix, AZ (US); Jo-Ann Theresa Schwartz, Fountain Hills, AZ (US); Laura Ledenbach, Gilbert, AZ (US); Steve Charles Winchester, Phoenix, AZ (US); Saifi Usmani, Phoenix, AZ (US); John Anthony Marsella, Allentown, PA (US); Martin Kamau Ngigi Mungai, Gilbert, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 14/482,590

(22) Filed: Sep. 10, 2014

(65) Prior Publication Data

US 2014/0374378 A1 Dec. 25, 2014

Related U.S. Application Data

(62) Division of application No. 14/030,657, filed on Sep. 18, 2013, now Pat. No. 8,859,428.

(60) Provisional application No. 61/716,471, filed on Oct. 19, 2012.

(51) Int. Cl.
*B44C 1/22* (2006.01)
*C09G 1/02* (2006.01)
(Continued)

(52) U.S. Cl.
CPC . *C09G 1/02* (2013.01); *C01F 17/00* (2013.01); *C09K 3/1463* (2013.01);
(Continued)

(58) Field of Classification Search
None
See application file for complete search history.

(56) References Cited

U.S. PATENT DOCUMENTS 5,021,567 A * 6/1991 Johnson et al. ............... 540/470
5,230,833 A 7/1993 Romberger et al.
(Continued)

FOREIGN PATENT DOCUMENTS

JP 01113349 5/1989
JP 20015000922 1/2001
(Continued)

*Primary Examiner* — Binh X Tran
*Assistant Examiner* — David Cathey, Jr.
(74) *Attorney, Agent, or Firm* — Lina Yang

(57) ABSTRACT

Methods for removing, reducing or treating the trace metal contaminants and the smaller fine sized cerium oxide particles from cerium oxide particles, cerium oxide slurry or chemical mechanical polishing (CMP) compositions for Shallow Trench Isolation (STI) process are applied. The treated chemical mechanical polishing (CMP) compositions, or the CMP polishing compositions prepared by using the treated cerium oxide particles or the treated cerium oxide slurry are used to polish substrate that contains at lease a surface comprising silicon dioxide film for STI (Shallow trench isolation) processing and applications. The reduced nano-sized particle related defects have been observed due to the reduced trace metal ion contaminants and reduced very smaller fine cerium oxide particles in the Shallow Trench Isolation (STI) CMP polishing.

9 Claims, 8 Drawing Sheets

(51) Int. Cl.
 *C09K 3/14* (2006.01)
 *H01L 21/3105* (2006.01)
 *B24B 1/00* (2006.01)
 *C01F 17/00* (2006.01)
 *H01L 21/762* (2006.01)

(52) U.S. Cl.
 CPC ....... *H01L 21/31053* (2013.01); *C09K 3/1409* (2013.01); *H01L 21/76224* (2013.01); *C01F 17/0043* (2013.01); *B24B 1/00* (2013.01)

(56) References Cited

U.S. PATENT DOCUMENTS

| | | | |
|---|---|---|---|
| 5,445,996 A | 8/1995 | Kodera et al. | |
| 5,597,341 A | 1/1997 | Kodera et al. | |
| 5,876,490 A | 3/1999 | Ronay | |
| 5,914,275 A | 6/1999 | Kodera et al. | |
| 6,077,437 A | 6/2000 | Hayashi et al. | |
| 6,117,220 A | 9/2000 | Kodama et al. | |
| 6,338,670 B1 * | 1/2002 | Okumura et al. | 451/60 |
| 6,824,579 B2 | 11/2004 | Ronay | |
| 6,964,923 B1 | 11/2005 | Ronay | |
| 2002/0032989 A1 * | 3/2002 | Kido et al. | 51/309 |
| 2002/0055323 A1 | 5/2002 | McClain et al. | |
| 2005/0076581 A1 | 4/2005 | Small et al. | |
| 2006/0234509 A1 | 10/2006 | Small et al. | |
| 2006/0278614 A1 | 12/2006 | Wang et al. | |
| 2007/0093183 A1 * | 4/2007 | Yoshikawa et al. | 451/41 |
| 2009/0029633 A1 | 1/2009 | Carter et al. | |
| 2012/0264304 A1 | 10/2012 | Ward | |

FOREIGN PATENT DOCUMENTS

| | | |
|---|---|---|
| JP | 2004521484 | 7/2004 |
| JP | 2007251141 | 9/2007 |
| JP | 2008172222 | 7/2008 |
| JP | 2008536302 | 9/2008 |
| JP | 2009010406 | 1/2009 |
| JP | 2011501406 | 1/2011 |
| WO | 9836045 | 8/1998 |
| WO | 0238335 A1 | 5/2002 |
| WO | 2006105020 A1 | 10/2006 |
| WO | 2006132905 A2 | 12/2006 |
| WO | 2009048203 A1 | 4/2009 |

* cited by examiner (a)

(b)

(c)

CHEMICAL MECHANICAL POLISHING (CMP) COMPOSITION FOR SHALLOW TRENCH ISOLATION (STI) APPLICATIONS AND METHODS OF MAKING THEREOF

CROSS-REFERENCE TO RELATED APPLICATIONS

This application is a divisional application of U.S. application Ser. No. 14/030,657, filed on Sep. 18, 2013, now issued U.S. Pat. No. 8,859,428; which claims benefit of U.S. Provisional Application No. 61/716,471, filed Oct. 19, 2012. The disclosures of those applications are hereby incorporated by reference.

BACKGROUND OF THE INVENTION

This invention relates to chemical mechanical planarization (CMP) for Shallow Trench Isolation (STI) process. More specifically, the present invention is directed to methods or processes of reducing (treating) trace metal contaminants and smaller or fine sized cerium oxide particles in cerium oxide particles or cerium oxide slurry and in STI polishing compositions.

Chemical mechanical polishing (CMP) compositions for Shallow Trench Isolation (STI) generally contain abrasive such as cerium oxide particles or colloidal cerium oxide particles, and suitable dispersing agents.

For example, U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

As another example, U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

However, those Shallow Trench Isolation (STI) polishing compositions usually contain trace metal contaminants, that are known to cause defects in a STI CMP process. The trace metal contaminants include, but not limited, to Al, Zr, Fe, Ni, Mg and others.

In addition, very small and fine cerium or colloidal cerium oxide particles in the STI polishing compositions are also known to cause defects in a STI CMP process.

Thus, there is still a need for Shallow Trench Isolation (STI) polishing compositions that provide reduced trace metal contaminants; and reduced very small and fine cerium oxide particles to achieve reduced defects in a STI chemical and mechanical polishing (CMP) process.

BRIEF SUMMARY OF THE INVENTION

Described herein are CMP polishing compositions for Shallow Trench Isolation (STI) process. The CMP polishing compositions provide reduced polishing defects due to the reduced trace metal contaminants and reduced smaller or fine sized cerium oxide particles. Described herein are also methods of reducing trace metal contaminants and smaller sized cerium oxide particles from cerium oxide slurries or Shallow Trench Isolation (STI) CMP polishing composition.

In one aspect, there is provided a chemical mechanical polishing (CMP) composition having reduced trace metal contaminants for Shallow Trench Isolation (STI) having reduced defects, comprising:
cerium oxide slurry having trace metal contaminants;
polymeric electrolyte;
biocide;
chemical chelator;
and solvent being deionized water;
wherein
the chemical chelator is hydroxyl quinoline or its derivatives having chemical structures selected from the group consisting of:

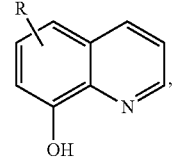

Structure 1

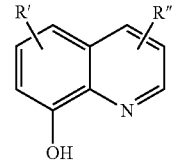

Structure 2 and combinations thereof;
wherein R is selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof;
R' and R" can be the same or different, and are independently selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;
wherein the chemical chelator reacts with trace metal ions in trace metal contaminants to form metal ion-chelator complexes.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In yet another aspect, there is provided a method of reducing trace metal contaminants and smaller sized cerium oxide particles in a cerium oxide slurry, comprising steps selected from the group consisting of:
(1) (a) adding ion exchange resin to the cerium oxide slurry to form a treated cerium oxide slurry; and (b) removing the ion exchange resin from the treated cerium oxide slurry through filtration to obtain treated cerium oxide slurry;
(2) running deionized water with controlled volume through the cerium oxide slurry with at least one filtration membrane to obtain treated cerium oxide slurry;

(3) (a) centrifuging the cerium oxide slurry at different centrifuge times and rotating at various speeds; (b) collecting cerium oxide particles from precipitate of centrifugation; and (c) mixing deionized water with the collected cerium oxide particles to form a new cerium oxide slurry; repeating steps (a) to (c) at least twice to have treated cerium oxide slurry made with cerium oxide particles from precipitate of the last centrifugation;

(4)(a) adding a chemical additive to the cerium oxide slurry to form a mixture containing water soluble chemical additive-metal ion complexes formed from the reaction of the chemical additive reacting with trace metal ions in the trace metal contaminants; (b) centrifuging the mixture; (c) collecting cerium oxide particles from precipitate of the centrifugation; (d) mixing deionized water with the collected cerium oxide particles to obtain treated cerium oxide slurry;

(5) adding a chemical chelator to the cerium oxide slurry to obtain treated cerium oxide slurry containing metal ion-chelator complexes formed from the reaction of the chemical chelator with trace metal ions in the trace metal contaminants; wherein the chemical chelator is hydroxyl quinoline or its derivative having chemical structure selected from the group consisting of:

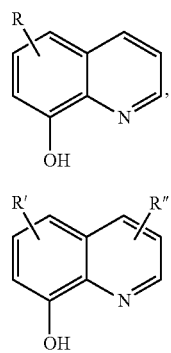

Structure 1

Structure 2 and combinations thereof;
wherein R is selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; R' and R" can be the same or different, and are independently selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;
wherein the chemical chelator reacts with trace metal ions in trace metal contaminants to form metal ion-chelator complexes.
and
combinations thereof.

In another aspect, there is provided a method of chemical mechanical polishing (CMP) a substrate having at least one surface comprising silicon dioxide using the chemical mechanical polishing (CMP) composition comprising the treated cerium oxide slurry described above in Shallow Trench Isolation (STI) process.

In yet another aspect, there is provided a method of forming Chemical mechanical polishing (CMP) composition for Shallow Trench Isolation (STI) comprising:
reducing trace metal contaminants and smaller sized cerium oxide particles in a cerium oxide slurry to form a treated cerium oxide slurry;
adding polymeric electrolyte to the treated cerium oxide slurry; and
adding biocide to the treated cerium oxide slurry;
wherein the reducing comprising steps selected from the group consisting of:

(1) (a) adding ion exchange resin to the cerium oxide slurry to form a treated cerium oxide slurry; and (b) removing the ion exchange resin from the treated cerium oxide slurry through filtration to obtain treated cerium oxide slurry;

(2) running deionized water with controlled volume through the cerium oxide slurry with at least one filtration membrane to obtain treated cerium oxide slurry;

(3) (a) centrifuging the cerium oxide slurry at different centrifuge times and rotating at various speeds; (b) collecting cerium oxide particles from precipitate of centrifugation; and (c) mixing deionized water with the collected cerium oxide particles to form a new cerium oxide slurry; repeating steps (a) to (c) at least twice to have treated cerium oxide slurry made with cerium oxide particles from precipitate of the last centrifugation;

(4)(a) adding a chemical additive to the cerium oxide slurry to form a mixture containing water soluble chemical additive-metal ion complexes formed from the reaction of the chemical additive reacting with trace metal ions in the trace metal contaminants; (b) centrifuging the mixture; (c) collecting cerium oxide particles from precipitate of the centrifugation; (d) mixing deionized water with the collected cerium oxide particles to obtain treated cerium oxide slurry;

(5) adding a chemical chelator to the cerium oxide slurry to obtain treated cerium oxide slurry containing metal ion-chelator complexes formed from the reaction of the chemical chelator with trace metal ions in the trace metal contaminants; wherein the chemical chelator is hydroxyl quinoline or its derivative having chemical structure selected from the group consisting of:

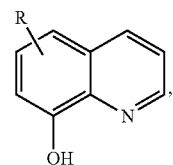

Structure 1

Structure 2 and combinations thereof;
wherein R is selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; R' and R" can be the same or different, and are independently selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; wherein the chemical chelator reacts with trace metal ions in trace metal contaminants to form metal ion-chelator complexes.
and
combinations thereof.

In another aspect, there is provided a method of chemical mechanical polishing (CMP) a substrate having at least one surface comprising silicon dioxide using the chemical mechanical polishing (CMP) composition comprising the treated cerium oxide slurry described above in Shallow Trench Isolation (STI) process.

Examples of a polymeric electrolyte includes but not limited to ammonium salt of polyacrylic acid, ammonium salt of polyvinyl sulfonic acid, ammonium salt of poly(4-styrene sulfonic acid), and combinations thereof. Examples of a chemical chelator includes but not limited to 8-hydroxyl quinoline, 8-hydroxyl quinoline-5-sulfonic acid, and combinations thereof. Examples of a chemical additive includes but not limited to oxalic acid having concentration ranging from 0.01M to 0.1M. The ion exchange resin can be a cationic ion exchange resin or an anionic ion exchange resin. Examples of a cationic ion exchange resin includes but not limited to proton or potassium ions; and an anionic ion exchange resin includes but not limited to an anionic ion exchange resin having hydroxyl group.

DETAILED DESCRIPTION OF THE INVENTION

Figure 1:
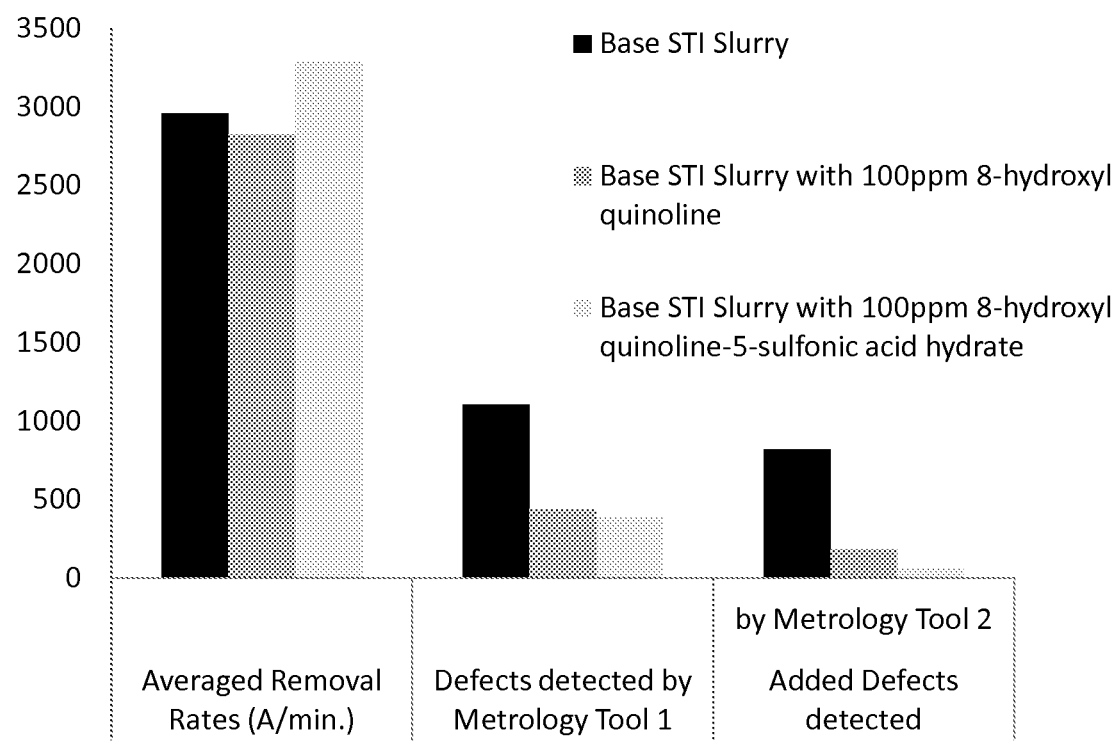
FIG. 1 shows the impacts of STI Slurry with or without chelators on TEOS Removal Rates and Defect Counts.

Trace metal contaminants in polishing compositions include, but not limited, to Al, Zr, Fe, Ni, Mg and others. In general, trace metal contaminants and the smaller sized (<10 nm) cerium oxide particles in polishing compositions are considered to be two root causes for the potentially increased nano-sized particle related defects. Trace metal ions and their related oxide particles can migrate or penetrate into the oxide film lattices, forming nano-sized residues on wafer surfaces in a STI CMP process.

The present invention is directed to methods or processes of reducing trace metal contaminants and smaller or fine sized cerium oxide particles in cerium oxide particles or cerium oxide slurry or ceria abrasive. The present invention is also directed to methods or processes of reducing trace metal contaminants and smaller or fine sized cerium oxide particles in STI polishing compositions.

Removing or reducing trace metal contaminants and smaller sized cerium oxide particles in ceria abrasives or STI polishing compositions can reduce the defects that might be introduced from these trace metal contaminants or smaller sized cerium oxide particles in a STI CMP process.

A number of treating methods or embodiments for reducing trace metal and smaller sized and fine cerium oxide particles are described herein.

Chemical Chelator Treatment

A chemic additive acting as chelator is added into the cerium oxide slurry or STI polishing compositions. The chemical chelator reacts with trace metal ions to form neutral, or charged metal ion-chelator complexes. The complexes can be removed more easily from wafer surface in a STI CMP process. Thus, the trace metal contaminants induced defects can be reduced.

Ion-Exchange Resin Treatment

An ion-exchange resin is used to treat cerium oxide slurry to remove or reduce trace metal ions from the cerium oxide slurry.

Ultra Filtration Treatment

Ultra filtration is used to remove or reduce trace metal contaminants ions from the cerium oxide slurry.

Deionized Water Washing and Centrifuge Treatment

To remove smaller fine sized cerium oxide particles, a cerium oxide slurry is rinsed with deionized water (DI water) and then centrifuged. The treated cerium oxide particles are used for the preparation of STI polishing compositions to reduce the defects caused by the smaller sized cerium oxide particles on the wafer surfaces.

Chemical Additive Treatment

By adding suitable chemical additives into the cerium oxide slurry, the solution is treated either at room temperature or at elevated temperature with subsequent pH adjustment.

In such treatment, the suitable chemical additives can react with various trace metal ions to form water soluble chemical additive-metal ion complexes so that such water soluble chemical additive-metal ion complexes can be removed from the supernatant solution phase after centrifuging the treated cerium oxide slurry.

The cerium oxide slurry being treated by any one of the method described above, can be further treated by any other, or any combinations of other methods. For example, the cerium oxide slurry being treated by suitable chemical additives, can be further treated by any one, or combinations of, Chemical Chelator Treatment; ion exchange resin treatment, ultra filtration treatment, and deionized water washing and centrifuge treatment described above.

Upon the reduction of trace metal contaminants in the cerium oxide slurry, the treated cerium oxide slurry is used to make STI polishing compositions. The defects, such as metal ion penetrating into silicon oxide films or forming nano-sized residues on wafer surfaces from a STI CMP process can be reduced.

In the following working examples, a STI polishing composition comprising 1.5 wt % cerium oxide with density larger than 6.8 g/cm$^3$; 0.1 to 0.5 wt % an ammonium salt of polyacrylic acid; a biocide ranging from 0.0001% to 0.05%, and solvent being deionized water, was prepared. This STI polishing composition was used as a base/control reference.

A cerium oxide slurry comprising 40 wt % cerium oxide particles, and solvent being deionized water was also prepared and used as a base/control reference.

Chemical Chelator Treatment

By adding a chemical additive as chelator (or ligand) to a STI polishing composition or a cerium oxide slurry, the chelator reacts with trace metal ions to form Metal Ion-Chelator complexes.

The metal-ion-chelator complexes can be in neutral form with no net charges on the whole complex molecules or can be the complexes either carrying positive charges or negative charges. The preferred form of the complexes is a non-charged neutral complex compound in aqueous solutions. The neutral complexes have less interactions with the silicon oxide films to be polished.

The complexes are removed more easily from wafer surface in a STI CMP process to potentially reduce or prevent the adhesion and the penetration of trace metal ions onto or into the high density silicon dioxide films. Thus, the trace metal contaminants induced defects can be reduced to enhance polishing performance with reduced total defects.

Examples of the chelators or ligands that can be used to form metal-ion-chelator complexes or metal-ion-ligand complexes include but not limited to: a). organic acids; b). amino acids; c). organic acid derivatives; d). amino acid derivatives; e). organic amine compounds; f). organic sulfuric acids; g). organic phosphoric acids; h). organic chelators containing multi-type function groups; i). pyridine and its derivatives; j). bipyridine and its derivatives; k). terpyridine and its derivatives; l). quinoline and its derivatives; m). hydroxyl quinoline and its derivatives; and n). the combinations of chelators or ligands as listed from a) to m).

Among above listed chelators or ligands, hydroxyl quinoline and its derivatives can form various complex compounds with different metal ions, such as aluminum, copper, nickel irons and others.

The hydroxyl quinoline and its derivatives have the following two general molecular structures:

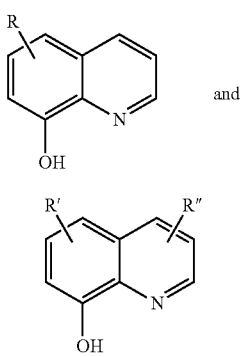

Structure 1 and

Structure 2

In molecular Structure 1, R can be alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof;

In molecular Structure 2, R' and R" can be the same or different, and are independently selected from alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;

Hydroxyl quinoline, such as, 8-hydroxyl quinoline and 8-hydroxyl quinoline-5-sulfonic acid was used as the chelating reagents in the working examples.

Working Examples

Composition 1

100 ppm 8-hydroxyl quinoline was added to the base STI polishing composition. The pH of the solution was about 5.5. The composition was then stirred overnight at room temperature.

The solution was then centrifuged at 10,000 rpm for 60 minutes. The supernatant solutions and the remaining cerium oxide particles were collected separately. The supernatant solution was analyzed by ICP-Mass Spectroscopy (Full digestion). The supernatant solution of the base STI polishing composition was used as the reference.

Composition 2

100 ppm 8-hydroxyl quinoline-5-sulfonic acid was added to the base STI polishing composition. The pH of the solution was about 5.25. The composition was then stirred overnight at room temperature.

The solution was then centrifuged at 10,000 rpm for 60 minutes. The supernatant solutions and the remaining cerium oxide particles were collected separately. The supernatant solution was analyzed by ICP-Mass Spectroscopy (Full digestion). The supernatant solution of the base STI polishing composition was used as the reference.

Composition 3

1,000 ppm 8-hydroxyl quinoline (chelator 1) was added to a 200 mL of Cerium Oxide (ceria) Slurry (40 wt %). The pH of the solution was about 9.5. The solution was stirred overnight at room temperature.

The solution was then centrifuged at 10,000 rpm for 60 minutes. The supernatant solutions and the remaining cerium oxide particles were collected separately. The supernatant solution was analyzed by ICP-Mass Spectroscopy (Full digestion). The supernatant solution from the base cerium oxide slurry was used as the reference.

Composition 4

1,000 ppm 8-hydroxyl quinoline-5-sulfonic acid hydrate (chelator 2) was added to a 200 mL of Cerium Oxide (ceria) (40 wt %) slurry. The pH of the solution was about 9.5. The solution was stirred overnight at room temperature.

The solution was then centrifuged at 10,000 rpm for 60 minutes. The supernatant solutions and the remaining cerium oxide particles were collected separately. The supernatant solution was analyzed by ICP-Mass Spectroscopy (Full digestion). The supernatant solution from the base cerium oxide slurry was used as the reference.

The results from compositions 1 and 2 were shown in Table 1 and FIG. 1.

With the addition of 100 ppm of 8-hydroxyl quinoline as the chelator additive, the averaged total defects after CMP process was reduced from 1107 for the base STI polishing composition to 443.

With the addition of 100 ppm of 8-hydroxyl quinoline-5-sulfonic acid hydrate as the chelator additive, the averaged total defects after CMP process were reduced from 1107 for the base STI polishing composition to 385.

Polishing Silicon Dioxide (TEOS) Films

TABLE 1

Effects of Chelator in STI Slurry on Removal Rates and Defects

| Composition | Averaged Removal Rates (A/min.) | Defects detected by Metrology Tool 1 | Added Defects detected by Metrology Tool 2 |
|---|---|---|---|
| Base STI Slurry | 2958 | 1107 | 821 |
| Base STI Slurry with 100 ppm 8-hydroxyl quinoline | 2826 | 443 | 186 |
| Base STI Slurry with 100 ppm 8-hydroxyl quinoline-5-sulfonic acid hydrate | 3290 | 385 | 58 |

It was observed that the total defects after CMP process detected by metrology tool 1 were reduced by using chelator 8-hydroxyl quinoline or 8-hydroxyl quinoline-5-sulfonic acid hydrate in the STI polishing composition, respectively.

Also as shown in Table 1, with the addition of 100 ppm of 8-hydroxyl quinoline as the chelator additive, the averaged total added defects after CMP process was reduced from 1107 for the reference STI polishing composition to 443. With the addition of 100 ppm of 8-hydroxyl quinoline-5-sulfonic acid hydrate as the chelator additive, the averaged total defects after CMP process was reduced from 1107 for the reference STI polishing composition to 385.

ICP-Mass Spectroscopy analytic results indicated a larger than 30% Zr concentration reductions on the composition being treated with two chelators.

The removal rates of polishing silicon dioxide film were also shown in Table 1. The result indicated that the removal rates were similar while having the benefit of reduced defects.

Figure 2:
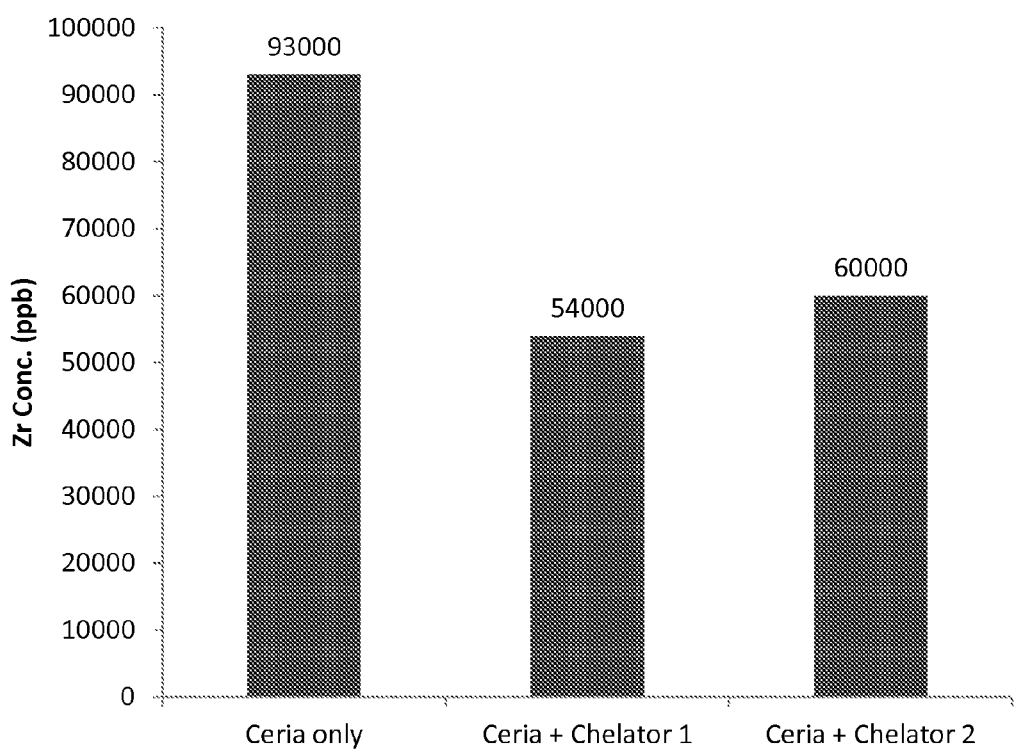
FIG. 2 shows the impacts of STI Slurry with or without chelators on Zr concentration reduction in chelator treated ceria particles.

The results from compositions 3 and 4 were shown in Table 2 and FIG. 2.

The addition of 1000 ppm of 8-hydroxyl quinoline as the chelator additive (chelator 1), the averaged total added defects after CMP process was reduced from 93000 for the Cerium Oxide (40 wt %) slurry to 54000. With the addition of 1000 ppm of 8-hydroxyl quinoline-5-sulfonic acid hydrate as the chelator additive (chelator 2), the averaged total defects after CMP process was reduced from 93000 for the Cerium Oxide (40 wt %) slurry to 60000.

TABLE 2

Zr Concentration Reduction in Chelator Treated Ceria Particles

| Samples | Zr Conc. (ppb) |
|---|---|
| Ceria only | 93000 |
| Ceria + Chelator 1 | 54000 |
| Ceria + Chelator 2 | 60000 |

ICP—Mass Spectroscopy analytic results indicated the Zr concentration of cerium oxide samples treated with chelator 1 or chelator 2 were reduced by more than 35% than that of reference cerium oxide sample without using any chelator for the treatment.

The cerium oxide slurry treated with chelator 1 or chelator 2 can then be used to prepare STI polishing compositions.

Ion-Exchange Resin Treatment

Working Example

Cerium oxide slurry was treated with various types of ion exchange resin. The ion exchange resin includes cationic ion exchange resin with potassium ions (Cationic-K Resin) or protons (Cationic-H Resin), and anionic ion exchange resin with hydroxyl groups (OH) (Anionic-OH Resin) on the surface.

In a typical ion exchange treatment process, either 40 wt % or the diluted 10 wt % cerium oxide slurry was used. After treatment, the recovered cerium oxide slurry has the concentrations several percent less than 40% and 10% respectively.

The ion exchange resin was added to or mixed with the cerium oxide slurry under stirring condition for 15 to 20 minutes. Afterwards, ion exchange resins were removed from the solution through filtration (filters). The steps were repeated at least three times to complete the ion exchange treatment.

Upon the completion of ion exchange resin treatment process, the collected cerium oxide slurry was centrifuged. The supernatant solutions and the residues of cerium oxide particles were collected for ICP-Mass Spectroscopy analysis on trace metal ion concentrations.

Following the procedure about, a cationic ion exchange resin with potassium ions was used to treat the cerium oxide slurry (Cationic-K resin). The final treated cerium oxide slurry was centrifuged.

A cationic ion exchange resin with a proton functional group was used to treat the cerium oxide slurry (Cationic-H resin). The final treated cerium oxide slurry was centrifuged.

A mixed treatments from a cationic ion exchange resin and a anionic ion exchange resin were conducted in the following example.

A cationic ion exchange resin having potassium ions was used to treat the cerium oxide slurry first. The treated cerium oxide slurry was separated from the cationic ion exchange resin, and was treated subsequently with the anionic ion exchange resin having hydroxyl group as the functional groups. Then, the treated cerium oxide slurry was separated from the anionic ion exchange resin.

Such alternative ion exchange resin treatment was repeated three times.

Then, the collected cerium oxide slurry was further centrifuged. The supernatant and cerium oxide particle residues were collected for ICP-Mass Spectroscopy analysis on trace metal ion concentrations respectively.

The original cerium oxide slurry, without ion exchange process treatment and the centrifuge process, was also analyzed as the reference for trace metal ion concentrations by ICP-Mass Spectroscopy analysis.

Figure 3:
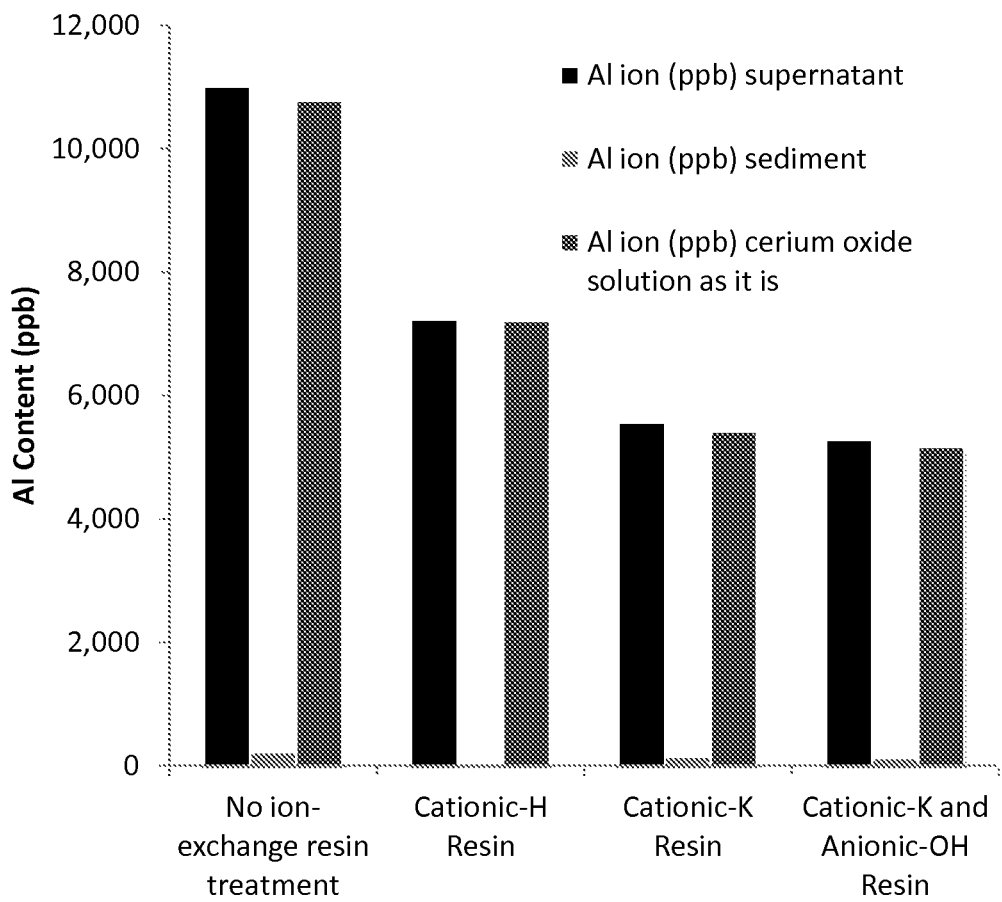
FIG. 3 shows the effects of different resin treatments on Al contents.

The results were shown in Table 3 and FIG. 3.

TABLE 3

Effects of Ion-Exchange Treatment on Aluminum Conc. In Cerium oxide slurry

| Ion Exchange Resin | Al ion (ppb) supernatant | Al ion (ppb) sediment | Al ion (ppb) cerium oxide slurry as it is |
|---|---|---|---|
| No ion-exchange resin | 11,000 | 220 | 10,780 |
| Cationic-H Resin | 7,232 | 26 | 7,206 |
| Cationic-K Resin | 5,554 | 140 | 5,414 |

TABLE 3-continued

Effects of Ion-Exchange Treatment
on Aluminum Conc. In Cerium oxide slurry

| Ion Exchange Resin | Al ion (ppb) supernatant | Al ion (ppb) sediment | Al ion (ppb) cerium oxide slurry as it is |
|---|---|---|---|
| Cationic-K Resin and Anionic-OH Resin | 5,281 | 120 | 5,161 |

As the results shown in Table 3 and FIG. 3, the ion exchange treatment processes reduced trace metal ion concentrations, especially Aluminum ion concentrations.

All three different ion-exchange resin treatments have shown reduced trace aluminum ion concentrations to different degrees while comparing to the aluminum ion concentrations detected for the original cerium oxide slurry without using ion exchange resin treatments.

The cerium oxide slurry after ion-exchange resin treatments can be used to prepare STI polishing compositions.

Ultra Filtration Treatment

Working Example 1

Ultra filtration method was used as another approach to remove or reduce trace metal contaminants such as Al, Ng, and Zr from cerium oxide particles used for STI polishing compositions.

In this method, at least one suitable filtration membrane was employed. The cerium oxide slurry was treated by running deionized water with controlled volume to allow the continuous replacement of solvent (such as deionized water) in the cerium oxide slurry. Such continuous replacement of solvent helped to reduce or remove the trace metal contaminants from the cerium oxide particles.

Figure 4:
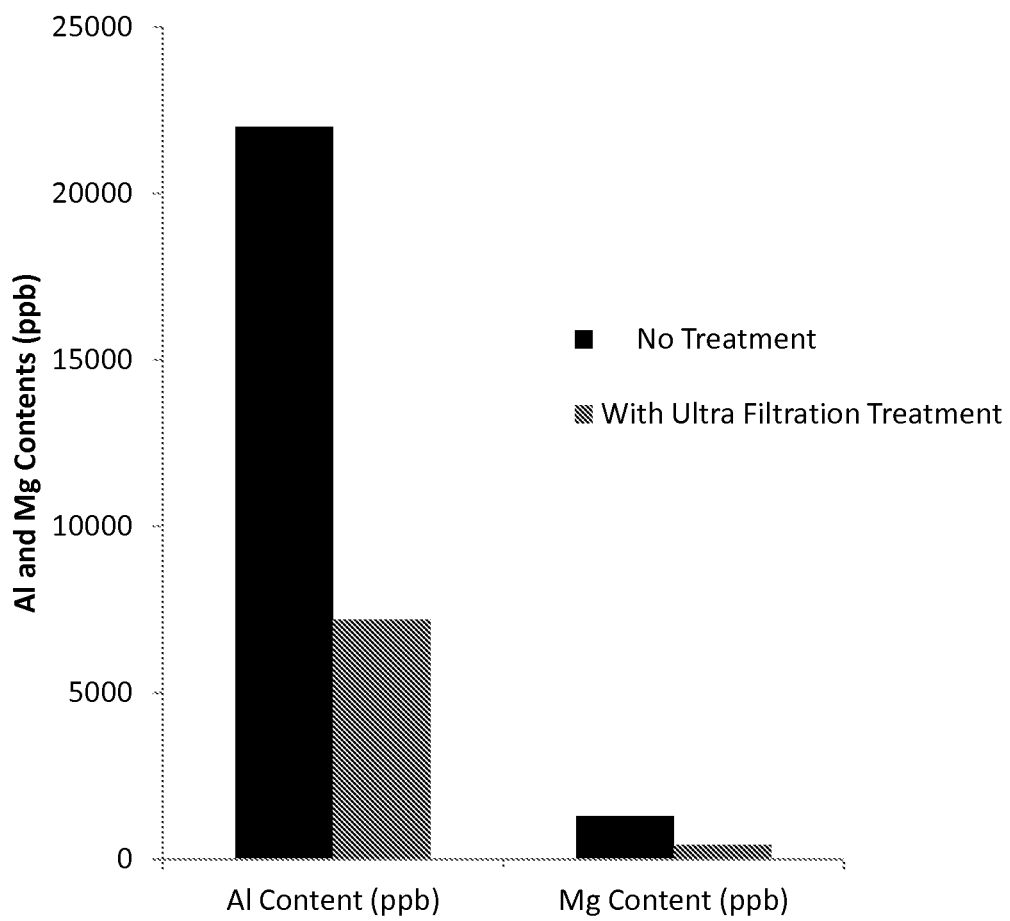
FIG. 4 shows the effects of ultra filtration treatment on Al and Mg contents.
Figure 5:
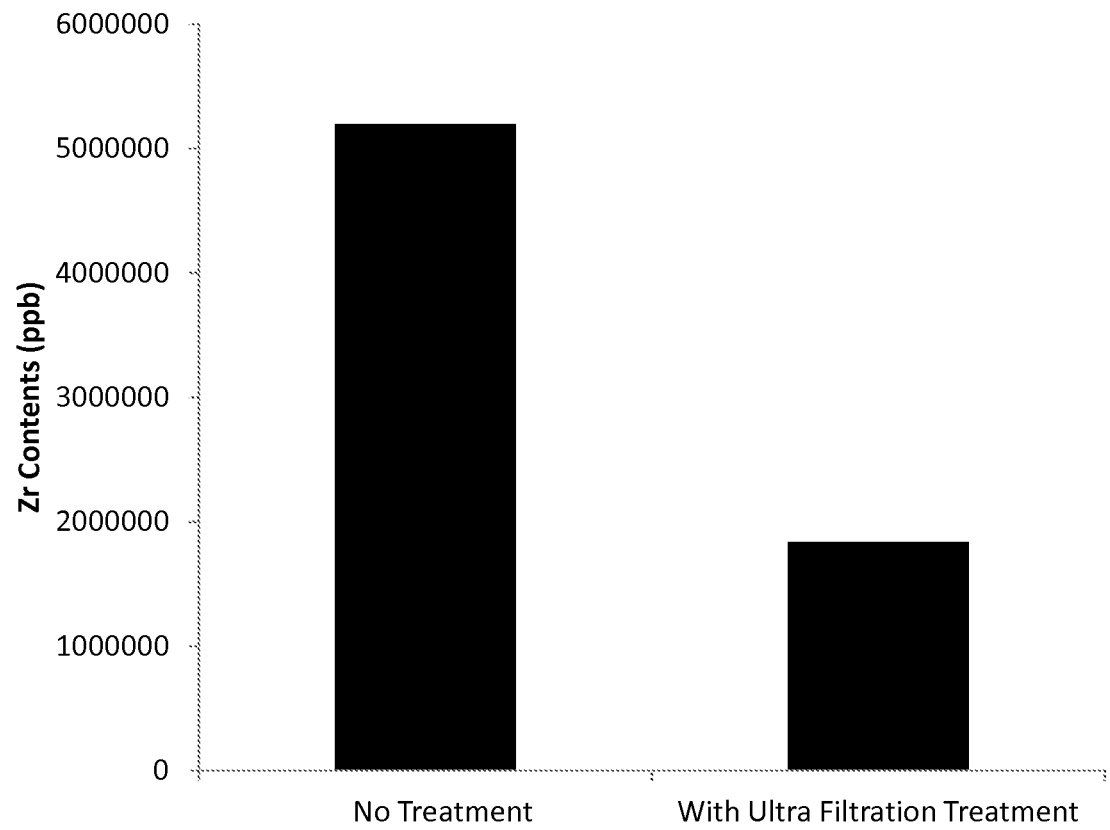
FIG. 5 shows the effects of ultra filtration treatment on Zr contents.

The results were shown in Table 4, and FIGS. 4 and 5.

TABLE 4

Ultra Filtration Treatment Process and AL, Mg, Zr Contents

| Ceria Particle Ultra Filtration Treatment Process | Al Content (ppb) | Mg Content (ppb) | Zr Content (ppb) |
|---|---|---|---|
| No Treatment | 22000 | 1300 | 5200000 |
| With Ultra Filtration Treatment | 7200 | 440 | 1840000 |

As the results shown in Table 4, a new milled cerium oxide slurry was used in ultra filtration treatment process. Without ultra filtration treatment, the Al, Mg, and Zr contents were 22000 ppb, 1300 ppb, and 5200000 ppb respectively. After ultra filtration process treatment, the Al, Mg and Zr contents were reduced to 7200 ppn, 440 ppb, and 1840000 ppb respectively which correspond to 205.6% reduction in Al content, 195.5% reduction in Mg content, and 182.6% reduction in Zr content.

The cerium oxide slurry after ultra filtration process treatment can be used to prepare STI polishing compositions.

Working Example 2

The treatment started with inducing agglomeration of ceria particles, collecting the treated ceria particles through the ultrafiltration process, and then conducting re-dispersion to get the treated cerium oxide particle solution.

In this treatment, saturated potassium nitrate ($KNO_3$) was added to the pre-prepared 10% cerium oxide particle solution under stirring condition until the conductivity of the solution reaching ~19.8-20 mS/cm. The stirring was continued for 5 more minutes before it was stopped. The solution was sat for 20 minutes to allow the ceria particles settle down. The upper layer solution was then removed, and the deionized water (DIW) was added into the solution (part of the re-dispersion). The new solution was stirred for 5 minutes. Then, the $KNO_3$-settlement-DIW steps stated before were repeated two more times. The final remained ceria solution was filtered through ultra filtration until the solution conductivity reaching ~200-300 µS/cm. After that, the ceria particle solution was sonicated for 30 minutes to break down some agglomerated ceria particles, to complete the re-dispersion process.

Figure 6:
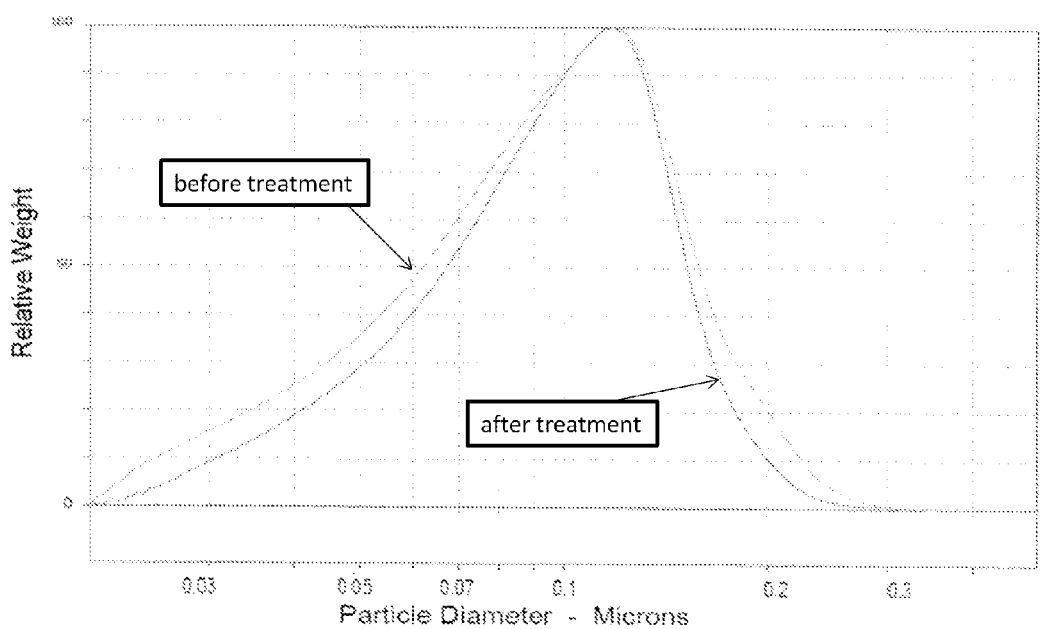
FIG. 6 shows the particle size and distribution of the treated and re-dispersed cerium particles after the ultra filtration treatment.

The particle size and distribution (PSD) of the treated cerium particles was analyzed and shown in FIG. 6.

As the PSD curves indicated in FIG. 6, the treated ceria particles had a narrower PSD showing that the treatment process effectively reduced the smaller sized fraction of ceria particles, at the same time, also reduced some larger sized ceria particles. Such new narrow sized ceria particles can be used to prepare STI polishing compositions and may provide the benefits of reducing defects while being used for STI polishing slurry and applications.

Deionized Water Washing and Centrifuge Treatment

In this method, the deionized water was added to the cerium oxide particles performing the function of rinsing or washing cerium oxide particles. Then, the well-controlled centrifuge and separation process, also called multi-passes, were used to reduce or remove smaller sized and fine cerium oxide particles (or ceria particles).

Working Example

In the working experiments, the deionized water was added to the cerium oxide particles to make concentrated (40 wt %) cerium oxide slurry, while stirring at room temperature for 15 to 20 minutes. The cerium oxide slurry was stirred or shaken thoroughly to increase the washing process efficiency. Then, different centrifuge times and various rotating speed (rotations per minute) were selected to treat the cerium oxide slurry.

After centrifuging at different centrifuge times and rotating at various speeds, the separation process started. The supernatant solutions were removed and discarded, the remaining cerium oxide particles were re-dispersed in deionized water.

The washing, centrifuge and separation process repeated to have multi passes.

The particle distributions were measured by light scattering technique to monitor the changes of the particle distributions.

The analytic results of the particle distributions revealed that very small sized (less than 10 nm) cerium oxide particle percentages were reduced, which also led to the slight shift of mean particle size toward the increased MPS direction.

The percentages of the very small cerium oxide particles were reduced in the ranges of more than 11% to 78% depending on the number of the passes treating the cerium oxide slurry. The small particle fraction was reduced 11.2%, 27.8%, 50.6% and 78.3% corresponding to the wash pass 1, 2, 3 and 4, respectively, compared to the control cerium oxide slurry. The results were shown in Table 5.

Further, a new STI polishing composition was made by using the cerium oxide particles having reduced very small sized cerium oxide particles (after 4 washes) to replace the cerium oxide particles in the base/control reference STI slurries.

TABLE 5

Effects of to Reducing Small Particles of Ceria

| DI-Water Washing Treatment | Small Ceria Particle % | Small Ceria Particle Reduction % |
|---|---|---|
| No wash | 100% | 100% |
| Wash 1 | 88.8% | −11.2% |
| Wash 2 | 72.2% | −27.8% |
| Wash 3 | 49.4% | −50.6% |
| Wash 4 | 21.7% | −78.3% |

The polishing testing using the STI polishing composition made from the cerium oxide particles having reduced very small sized cerium oxide particles was conducted and compared with the results obtained from the standard/control STI composition.

Figure 7:
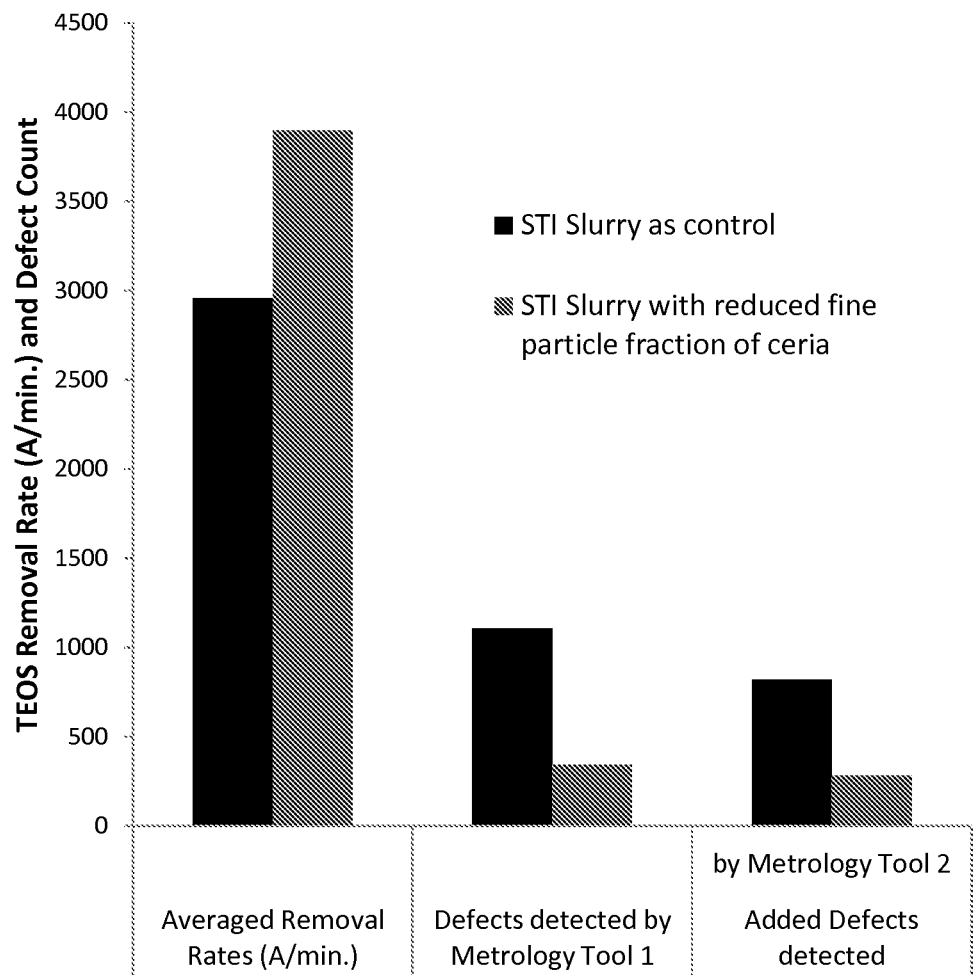
FIG. 7 shows the impacts of STI Slurry with reduced fine ceria particles on TEOS Removal Rates and Defect Counts.

The results were shown in Table 6 and FIG. 7.

TABLE 6

Effects of Reducing Fine Particle Fraction of Ceria in STI Slurry on Removal Rates and Defects

| Composition | Averaged Removal Rates (A/min.) | Defects detected by Metrology Tool 1 | Added Defects detected by Metrology Tool 2 |
|---|---|---|---|
| STI Slurry as control | 2958 | 1107 | 821 |
| STI Slurry with reduced fine particle fraction of ceria | 3898 | 344 | 282 |

As shown in Table 6 and FIG. 7, when cerium oxide particles having reduced very small sized cerium oxide particles was used in STI polishing composition, the removal rate of polishing silicon dioxide film was increased from 2958 A/minute to 3898 A/minute. The total defects detected by metrology tool 1 was reduced from 1107 to 344 The total added defects after CMP process and detected by metrology tool 2 was reduced from 821 to 282.

The results indicated that using multi-pass deionized water washing and centrifuge treatment, the fine particle fractions were indeed reduced, which led the total defects in a STI CMP process were reduced.

Chemical Additive Treatment

In this treatment, the suitable chemical additives are added to cerium oxide slurry. The suitable chemical additives can react with various trace metal ions in the cerium oxide slurry to form water soluble chemical additive-metal ion complexes so that such water soluble chemical additive-metal ion complexes can be removed from supernatant solution phase after centrifuging the treated cerium oxide slurry.

The suitable chemical additives include, but not limited to, a). organic acids; such as oxalic acid, citric acid, malic acid, tartaric acid, maleic acid, itaconic acid, gluconic acid, lactic acid, ETDA, and others; b). amino acids; such as glycine, alanine, serine, proline, and others; c). organic acid derivatives which refer to all organic compounds that contain at least one or more than one carboxylic acid group(s); d). amino acid derivatives which refer to all organic compounds that contain at least one or more than one amine acid moieties others; such as iminodiacetic acid; e). organic amine compounds others; such as ethylene diamine, propylene diamine, ethylenimine, and other organic compounds that contain primary or secondary amino groups; f). organic sulfuric acids that refer to all organic compounds that contain at least one or more sulfuric acid group(s); g). organic phosphoric acids that refer to all organic compounds that contain at least one or more phosphoric acid group(s); h). pyridine and its derivatives others; such as pyridine, 2-methylpyridine, and substituted pyridine at position 2, 3, 4, 5 or 6 respectively; i). bipyridine and its derivatives others; such as 2,2'-bipyrine, 4,4'-dimethyl bipyridine, 4,4'-bipyridine, and all other substituted 2,2'-bipyrine or 4,4'-bipyridine derivatives; j). terpyridine and its derivatives; k). quinoline and its derivatives; m). hydroxyl quinoline and its derivatives; and m). ammonium hydroxide.

If the chemical additive is in solid state, then the first step of the method is adding the chemical additive into a cerium oxide slurry to treat the cerium oxide particles in the solution. If the chemical additive is a solution, then cerium oxide powder or cerium oxide slurry can be added to the chemical additive solution. The treatment can be performed either at room temperature or at elevated temperature with subsequent pH adjustment. The collected cerium oxide particles from the centrifugation are mixed with deioized water to form a new cerium oxide slurry.

Working Example

Lower concentration oxalic acid (0.01M) was used to treat 12 wt % cerium oxide slurry first. The mixture of lower concentration oxalic acid with 12 wt % cerium oxide slurry was stirred and heated for 3 to 4 hours under $N_2$ protection. Upon the completion of the heating treatment process, the mixed solution of oxalic acid with cerium oxide particles was centrifuged and the supernatant solution was decanted off.

The deionized water was then added to the cerium oxide particles collected from the centrifuge process as the precipitate. The resulting cerium oxide slurry was adjusted to basic pH condition using low concentration of KOH.

The trace metal ion concentrations in treated cerium oxide slurry was conducted by ICP-Mass Spectroscopy analysis through full digestion method.

TABLE 7

Effects of Chemical Additive Treatment at Heating Condition on Al, Mg, and Zr Ion Concentrations in Cerium Oxide Particle Slurry

| Sample | Al ion (ppb) | Mg ion (ppb) | Zr ion (ppb) |
|---|---|---|---|
| Untreated cerium oxide slurry | 11,000 | 120 | 2700,000 |
| Treated with oxalic acid at 70° C. | 5,660 | 157 | 57,000 |

Figure 8:
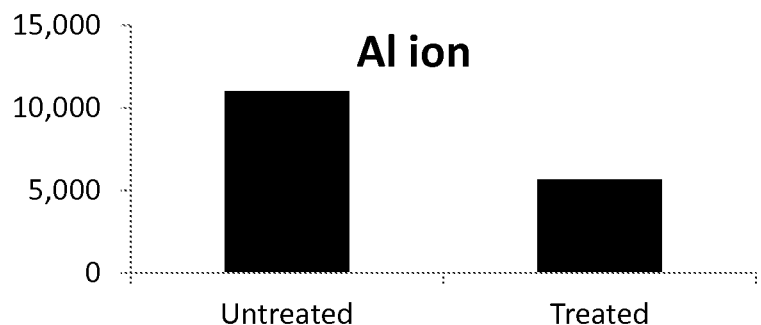
FIG. 8 shows the effects of chemical additive treatment on Al contents—FIG. 8 (*a*), on Mg contents—FIG. 8 (*b*), and on Zr contents—FIG. 8 (*c*).
Figure 8:
Figure 8:
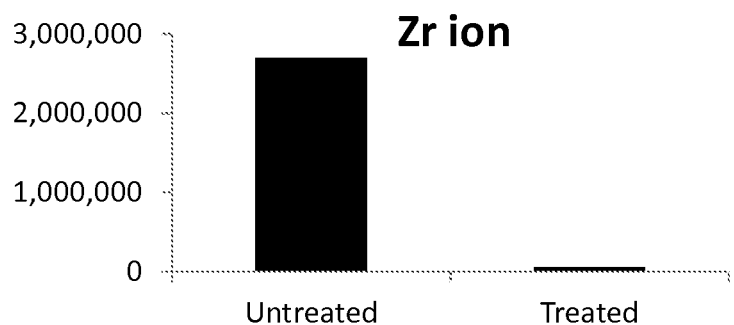

As the results shown in Table 7 and FIG. 8, the ion exchange treatment processes reduced trace metal ion concentrations, especially Aluminum ion concentrations.

All three different ion-exchange resin treatments have shown reduced trace aluminum ion concentrations to different degrees while comparing to the aluminum ion concentrations detected for the original cerium oxide slurry without using ion exchange resin treatments.

The analytic results of several trace metal ion concentrations in the treated cerium oxide slurry along with those trace metal ion concentrations in an untreated cerium oxide slurry were listed in Table 7 and FIG. 8(a)-(c).

As shown in Table 7, the Al and Zr metal ion concentrations were reduced by a relatively large percentage after the treatment. Mg ion concentration was slightly increased after the treatment. These results indicated that the treatment was an effective way to remove some trace metal ions, such as Al and Zr, from cerium oxide slurry.

Further shown in Table 7, using the chemical additives to treat the cerium oxide particles in solution at different temperatures was an efficient approach to reduce the Al and Zr contents in cerium oxide particles. Such effective Al and Zr content reduction mainly due to that these chemical additives can react with Al or Zr contained on cerium particle surfaces to convert them to the soluble Al or Zr chemical additive complexes, after that, the cerium oxide particles can be separated from supernatant and re-dispersed for making STI slurry formulations with reduced Al and Zr contents.

When the concentration of oxalic acid was changed from 0.01M to 0.1M, there was no impact observed on Al content (ppb) which indicated that 0.01M of oxalic acid concentration was adequate for the efficient removal of some Al and Zr contents from cerium oxide particles.

The cerium oxide slurry after chemical additive treatment can be used to prepare STI polishing compositions.

The different treatments, methods or embodiments for reducing trace metal and smaller sized and fine cerium oxide particles described above, can be combined in any orders. For example, the cerium oxide slurry being treated by any one of the method described above, can be further treated by any other, or any combinations of other methods. For example, the cerium oxide slurry being treated by suitable chemical additives, can be further treated by any one, or combinations of, chemical chelator treatment; ion exchange resin treatment, ultra filtration treatment, and deionized water washing and centrifuge treatment described above.

Upon the reduction of trace metal contaminants in the cerium oxide slurry, the treated cerium oxide slurry is used to make STI polishing compositions. The defects, such as metal ion penetrating into silicon oxide films or forming nano-sized residues on wafer surfaces from a STI CMP process can be reduced.

The working examples and embodiments of this invention listed above, are exemplary of numerous embodiments that may be made of this invention. It is contemplated that numerous materials other than those specifically disclosed may be made. Numerous other configurations of the process may also be used, and the materials used in the process may be elected from numerous materials other than those specifically disclosed.

The invention claimed is:

1. A method of reducing trace metal contaminants and smaller sized cerium oxide particles in a cerium oxide slurry, comprising steps of:
(i) adding a chemical chelator to the cerium oxide slurry to obtain treated cerium oxide slurry; wherein the chemical chelator reacts with trace metal ions in trace metal contaminants to form metal ion-chelator complexes; and
(ii) centrifuging cerium oxide slurry obtained from step (i) to remove metal ion-chelator complexes and to remove smaller sized cerium oxide particles; wherein the chemical chelator having chemical structure selected from the group consisting of:

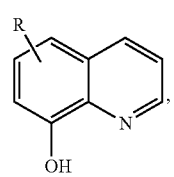

Structure 1

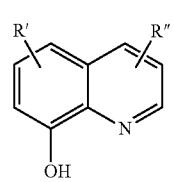

Structure 2 and combinations thereof;
wherein R is selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; one of R' and R" is selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and the other of R' and R" is selected from the group consisting of alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof.

2. The method of claim 1, wherein the method further comprises the steps of
(a) adding an ion exchange resin to the cerium oxide slurry; and (b) removing the ion exchange resin through filtration to obtain treated cerium oxide slurry; wherein the ion exchange resin is a cationic ion exchange resin or an anionic ion exchange resin;
wherein the ion exchange resin is selected from the group consisting of the cationic ion exchange resin having proton or potassium ions; and the anionic ion exchange resin having hydroxyl group.

3. The method of claim 2, wherein the ion exchange resin is the cationic ion exchange resin having potassium ions; and the method further comprising
(c) adding anionic ion exchange resin having hydroxyl group to the treated cerium oxide slurry after step (b);
(d) removing the anionic ion exchange resin from the cerium oxide slurry in (c) through filtration; and
repeating steps (a) to (d) at least twice.

4. The method of claim 1, wherein the method further comprises the steps of
(a) adding a chemical additive to the cerium oxide slurry to form a mixture; wherein the chemical additive reacts with trace metal ions in the trace metal contaminants to form water soluble chemical additive-metal ion complexes in the mixture; (b) centrifuging the mixture; (c) collecting cerium oxide particles from the precipitate of the centrifugation; and (d) mixing deionized water with the collected cerium oxide particles to obtain treated cerium oxide slurry;

wherein the chemical additive is selected from the group consisting of (a) organic acid selected from the group consisting of oxalic acid, citric acid, malic acid, tartaric acid, maleic acid, itaconic acid, gluconic acid, lactic acid, ETDA, and combinations thereof; (b) amino acids selected from the group consisting of glycine, alanine, serine, proline, and combinations thereof; (c) organic compound containing at least one carboxylic acid group; (d) amino acid derivatives containing at least one amine acid moieties or iminodiacetic acid; (e) organic amine compound selected from the group consisting of ethylene diamine, propylene diamine, ethylenimine, organic compound containing primary or secondary amino groups; and combinations thereof; (f) organic sulfuric acids containing at least one sulfuric acid group; (g) organic phosphoric acids containing at least one phosphoric acid group; (h) pyridine and its derivatives selected from the group consisting of pyridine, 2-methylpyridine, substituted pyridine at position 2, 3, 4, 5 or 6 respectively, and combinations thereof; (i) bipyridine and its derivatives selected from the group consisting of 2,2'-bipyrine, 4,4'-dimethyl bipyridine, 4,4'-bipyridine, and all other substituted 2,2'-bipyrine or 4,4'-bipyridine derivatives, and combinations thereof; (j) terpyridine and its derivatives; (k) quinoline and its derivatives; (l) hydroxylquinoline and its derivatives; and (m) ammonium hydroxide; and (n) combinations thereof.

5. The method of claim 4, wherein the chemical additive is oxalic acid having concentration ranging from 0.01M to 0.1M.

6. The method of claim 1, wherein the chemical chelator is selected from the group consisting of 8-hydroxylquinoline, 8-hydroxylquinoline-5-sulfonic acid, and combinations thereof.

7. The method of claim 1, wherein the method further comprises the step of running deionized water through the cerium oxide slurry using at least one ultra filtration membrane to obtain a treated cerium oxide slurry as retentate.

8. The method of claim 7, wherein the method further comprising (a) inducing agglomeration of cerium oxide particles before the step of running deionized water; and (b) sonicating the treated cerium oxide slurry after the step of running deionized water.

9. The method of claim 1, wherein the method further comprises the steps of (a) centrifuging the cerium oxide slurry; (b) collecting cerium oxide particles from the precipitate of centrifugation; (c) mixing deionized water with the collected cerium oxide particles to form a new cerium oxide slurry; and (d) repeating steps (a) to (c) at least twice to obtain a treated cerium oxide slurry comprising cerium oxide particles from the precipitate of the last centrifugation.

* * * * *